US012689859B2

(12) United States Patent
Narita et al.

(10) Patent No.: US 12,689,859 B2
(45) Date of Patent: Jul. 21, 2026

(54) ACOUSTIC DEVICE

(71) Applicant: TDK Corporation, Tokyo (JP)

(72) Inventors: Kaoru Narita, Tokyo (JP); Akira Satoh, Tokyo (JP); Kaoru Kijima, Tokyo (JP)

(73) Assignee: TDK CORPORATION, Tokyo (JP)

( * ) Notice: Subject to any disclaimer, the term of this patent is extended or adjusted under 35 U.S.C. 154(b) by 279 days.

(21) Appl. No.: 18/422,509

(22) Filed: Jan. 25, 2024

(65) Prior Publication Data

US 2024/0298118 A1      Sep. 5, 2024

(30) Foreign Application Priority Data

Mar. 3, 2023      (JP) ................................. 2023-032924

(51) Int. Cl.
| | |
|---|---|
| *H04R 17/00* | (2006.01) |
| *H04R 1/02* | (2006.01) |
| *H10N 30/20* | (2023.01) |
| *H10N 30/87* | (2023.01) |
| *H10N 30/88* | (2023.01) |

(52) U.S. Cl.
CPC ............. *H04R 17/00* (2013.01); *H04R 1/025* (2013.01); *H10N 30/20* (2023.02); *H10N 30/875* (2023.02); *H10N 30/88* (2023.02); *H04R 2400/11* (2013.01)

(58) Field of Classification Search
CPC ........ H04R 17/00; H04R 1/025; H10N 30/20; H10N 30/88; H10N 30/875
USPC .......................................... 381/190
See application file for complete search history.

(56) References Cited

U.S. PATENT DOCUMENTS

| | | | |
|---|---|---|---|
| 10,381,957 B2 * | 8/2019 | Hayamizu ............ | H10N 30/875 |
| 2015/0117682 A1 * | 4/2015 | Fukami ................. | B06B 1/0253 |
| | | | 381/190 |

FOREIGN PATENT DOCUMENTS

JP      2020-061001 A      4/2020

* cited by examiner

*Primary Examiner* — Sean H Nguyen
(74) *Attorney, Agent, or Firm* — Oliff PLC

(57)      ABSTRACT

An acoustic device includes a piezoelectric element and a housing holding the piezoelectric element. The housing includes a vibrator having a main surface to which the piezoelectric element is bonded, and a frame body bonded to the main surface to surround the piezoelectric element. The frame body is disposed inward of an outer edge of the main surface when viewed in a direction perpendicular to the main surface.

19 Claims, 13 Drawing Sheets

ACOUSTIC DEVICE

TECHNICAL FIELD

The present disclosure relates to an acoustic device. The present application claims priority to Japanese Patent Application No. 2023-032924 filed on Mar. 3, 2023, the content of which is incorporated herein by reference in its entirety.

BACKGROUND

An acoustic device that includes a piezoelectric element, a vibrator to which the piezoelectric element is bonded, and a housing that accommodates the piezoelectric element and the vibrator is known (e.g., Japanese Unexamined Patent Publication No. 2020-61001).

SUMMARY

One aspect of the present disclosure provides an acoustic device that can be made small and can facilitate manufacture.

An acoustic device according to one aspect of the present disclosure includes a piezoelectric element, and a housing holding the piezoelectric element, wherein the housing includes a vibrator having a main surface to which the piezoelectric element is bonded, and a frame body bonded to the main surface to surround the piezoelectric element, and wherein the frame body is disposed inward of an outer edge of the main surface when viewed in a direction perpendicular to the main surface.

In the acoustic device above, the vibrator is designed to serve also as the housing, so that the acoustic device can be made small. The frame body is disposed inward of the outer edge of the main surface of the vibrator, thereby facilitating the positioning of the vibrator and the frame body when stacking the frame body on the vibrator to form the housing. Manufacture is thus facilitated.

The acoustic device above may further may include a wiring member having an end portion connected to the piezoelectric element, the wiring member extending over the frame body and outside of the housing, and the frame body may include a fixing part that rivets the wiring member. In this case, since the wiring member is fixed by the fixing part, stress does not tend to be applied to the end portion of the wiring member bonded to the piezoelectric element. Connection between the wiring member and the piezoelectric element can thus be easily maintained.

The acoustic device above may further include a wiring member having an end portion connected to the piezoelectric element, the wiring member extending over the frame body and outside of the housing, the frame body may have a disposing surface on which the wiring member is disposed, and a height of the disposing surface relative to the main surface may be equal to a height of the piezoelectric element relative to the main surface. In this case, the wiring member can be kept flat on the piezoelectric element and the disposing surface, so that stress does not tend to be applied to the end portion of the wiring member bonded to the piezoelectric element. Connection between the wiring member and the piezoelectric element can thus be easily maintained.

The housing may further include a buffer member disposed on the frame body. In this case, the acoustic device can be attached to an external device so that the buffer member comes into contact with the external device. Thus, a gap does not tend to be formed between the acoustic device and the external device.

The buffer member may be disposed inward of a portion of an outer edge of the frame body that follows along the outer edge of the main surface when viewed in the direction perpendicular to the main surface. In this case, the positioning of the frame body and the buffer member is facilitated when stacking the buffer member on the frame body. Manufacture is thus facilitated.

The housing may include an attachment part to be attached to an external device. In this case, the acoustic device can be easily attached to the external device.

The housing may further include a buffer member disposed on the frame body, and a height of the attachment part relative to the main surface may be less than a height of the buffer member relative to the main surface, and more than a height of the frame body relative to the main surface. In this case, since the height of the attachment part relative to the main surface is less than the height of the buffer member relative to the main surface, a gap does not tend to be formed between the acoustic device and the external device when the acoustic device is attached to the external device. Additionally, since the height of the attachment part relative to the main surface is more than the height of the frame body relative to the main surface, warping of the frame body is suppressed when the acoustic device is attached to the external device.

The main surface may have a rectangular shape, and may have a first side and a second side forming opposite sides to each other and a third side and a fourth side forming opposite sides to each other, the frame body may extend along the first side, the second side, and the third side, and the piezoelectric element may be disposed closer to the fourth side than to the third side when viewed in the direction perpendicular to the main surface. In this case, since the piezoelectric element is disposed close to the fourth side, which forms a sound outlet, the high tone characteristic can be improved.

DETAILED DESCRIPTION

Embodiments will be described in detail below with reference to the accompanying drawings. Same reference signs are given to the same or corresponding elements in the description of the drawings, and redundant description will be omitted.

Figure 1:
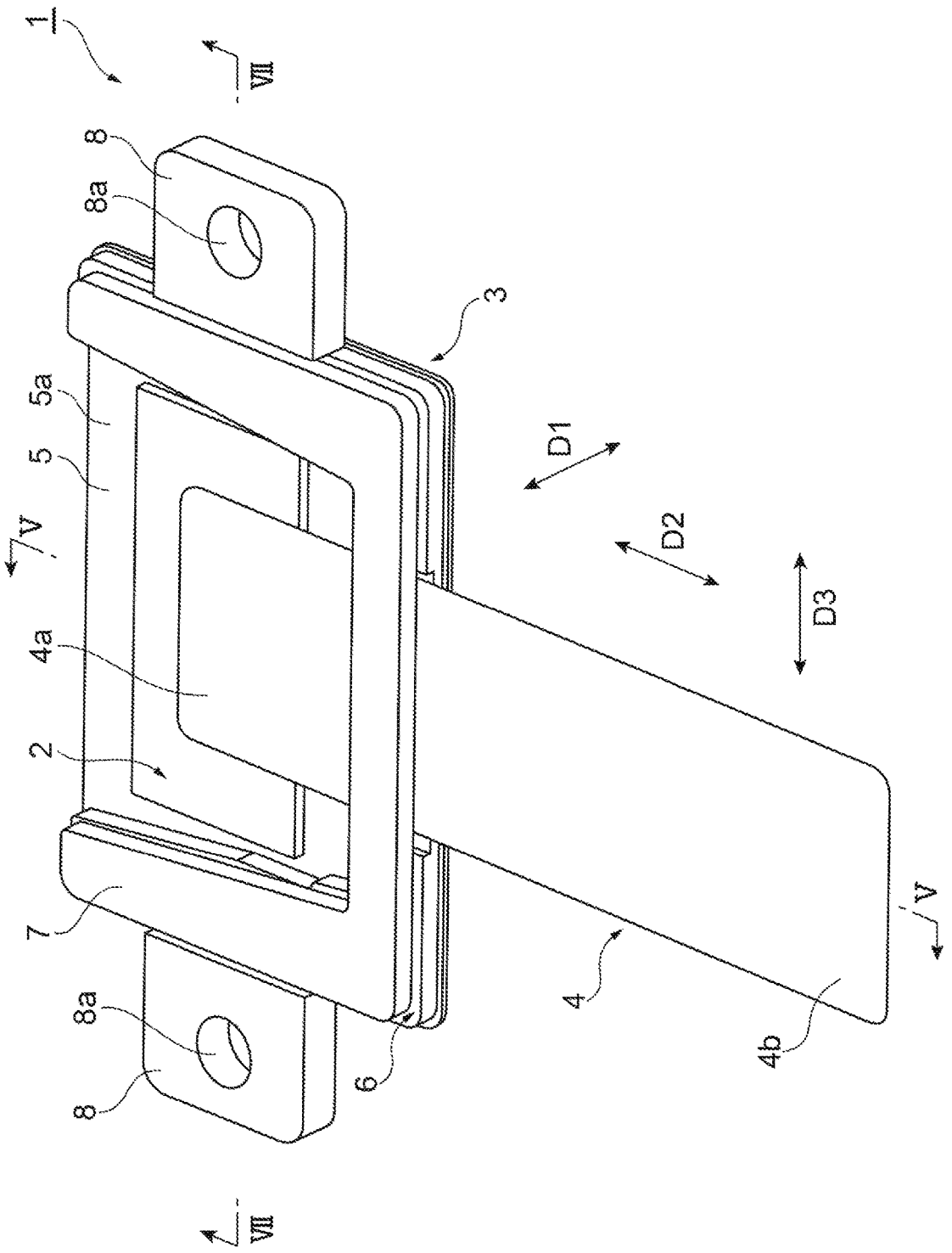
FIG. 1 is a perspective view illustrating an acoustic device according to an embodiment.
Figure 2:
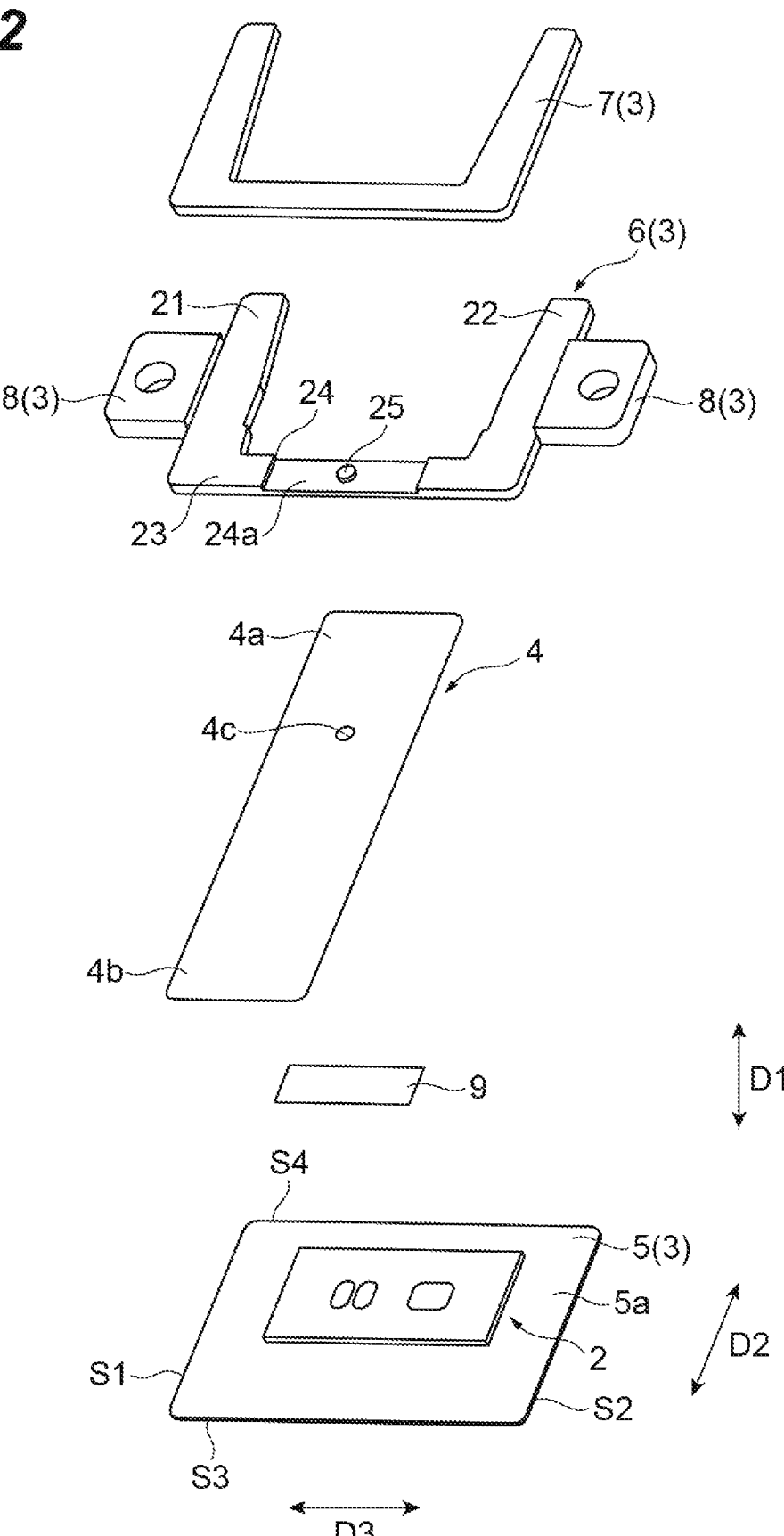
FIG. 2 is an exploded perspective view of the acoustic device of FIG. 1.

FIG. 1 is a perspective view illustrating an acoustic device according to an embodiment. FIG. 2 is an exploded perspective view of the acoustic device of FIG. 1. As illustrated in FIGS. 1 and 2, an acoustic device 1 according to the embodiment includes a piezoelectric element 2, a housing 3, and a wiring member 4. The acoustic device 1 is a piezoelectric structure that is used, for example, as a speaker or a buzzer. The acoustic device 1 is used attached to an external device (not shown).

Figure 3:
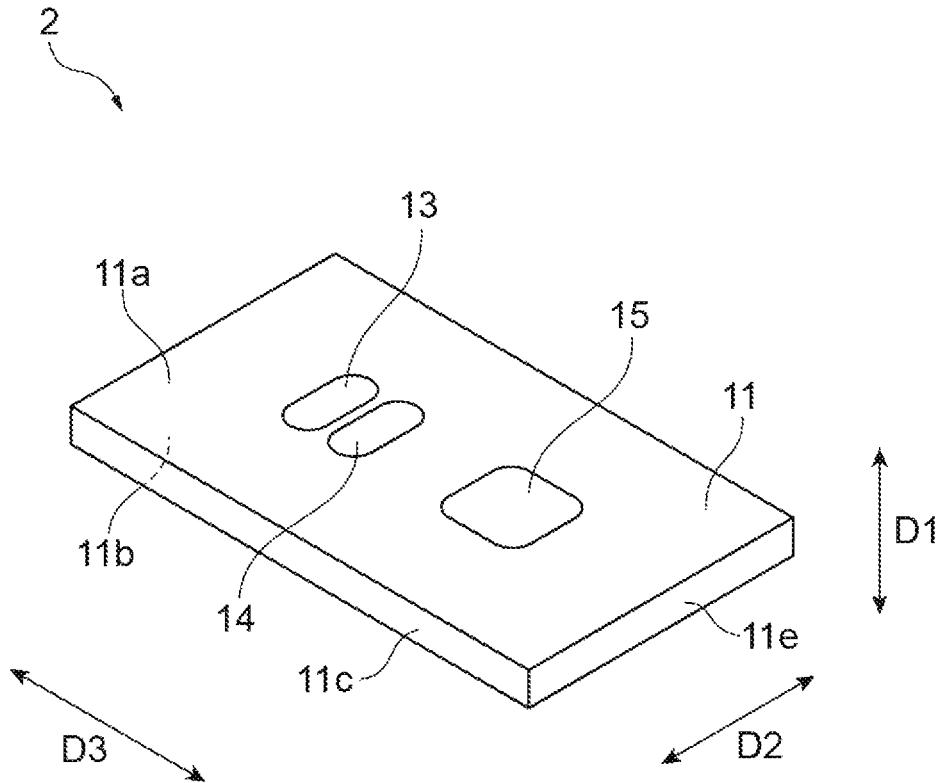
FIG. 3 is a perspective view illustrating a piezoelectric element.

FIG. 3 is a perspective view illustrating a piezoelectric element. The piezoelectric element 2 is, for example, a bimorph type. As illustrated in FIG. 3, the piezoelectric element 2 includes an element body 11 and a plurality of external electrodes 13, 14, 15. In this embodiment, the piezoelectric element 2 includes three external electrodes 13, 14, 15.

The element body 11 has a rectangular parallelepiped shape. The rectangular parallelepiped shape includes, for example, a rectangular parallelepiped shape in which the corners and edges are chamfered, and a rectangular parallelepiped shape in which the corners and edges are rounded. The element body 11 has main surfaces 11$a$, 11$b$ that face each other, a pair of side surfaces 11$c$ that face each other, and a pair of side surfaces 11$e$ that face each other. The direction in which the main surfaces 11$a$, 11$b$ face each other is a first direction D1. The first direction D1 is also a direction perpendicular to each of the main surfaces 11$a$, 11$b$. The direction in which the pair of side surfaces 11$c$ face each other is a second direction D2. The second direction D2 is also a direction perpendicular to each of the side surfaces 11$c$. The direction in which the pair of side surfaces 11$e$ face each other is a third direction D3. The third direction D3 is also a direction perpendicular to each of the side surfaces 11$e$.

Each of the main surfaces 11$a$, 11$b$ has a rectangular shape having a pair of long sides and a pair of short sides. That is, the piezoelectric element 2 (element body 11) has a rectangular shape having a pair of long sides and a pair of short sides in a plan view. The rectangular shape includes, for example, a rectangular shape in which the corners are chamfered and a rectangular shape in which the corners are rounded. In this embodiment, a long side direction of the main surfaces 11$a$, 11$b$ coincides with the third direction D3. A short side direction of the main surfaces 11$a$, 11$b$ coincides with the second direction D2.

The pair of side surfaces 11$c$ extend in the first direction D1 so as to connect the main surfaces 11$a$, 11$b$. The pair of side surfaces 11$c$ also extend in the third direction D3. The pair of side surfaces 11$e$ extend in the first direction D1 so as to connect the main surfaces 11$a$, 11$b$. The pair of side surfaces 11$e$ also extend in the second direction D2. The element body 11 has a length in the first direction D1, for example, of 0.49 mm. The element body 11 has a length in the second direction D2, for example, of 10 mm. The element body 11 has a length in the third direction D3, for example, of 20 mm.

The element body 11 has a plurality of piezoelectric layers stacked in the first direction D1. Each piezoelectric layer is formed of a piezoelectric material. Each piezoelectric layer is formed of a piezoelectric ceramic material. For example, PZT [Pb(Zr, Ti)O$_3$], PT (PbTiO$_3$), PLZT [(Pb, La)(Zr, Ti)O$_3$], or barium titanate (BaTiO$_3$) is used as the piezoelectric ceramic material. Each piezoelectric layer is formed, for example, of a sintered body of a ceramic green sheet including the piezoelectric ceramic material above. In the actual element body 11, the plurality of piezoelectric layers are integrated such that the boundaries between the layers cannot be recognized.

The external electrodes 13, 14, 15 are disposed on the main surface 11$a$ arranged in that order in the third direction D3. Each of the external electrodes 13, 14, 15 is formed of a conductive material. For example, Ag, Pd, Pt, or a Ag—Pd alloy is used as the conductive material. Each of the external electrodes 13, 14, 15 is formed, for example, as a sintered body of a conductive paste including the conductive material above.

Each of the external electrodes 13, 14 has a rectangular shape with the second direction D2 being the long side direction when viewed in the first direction D1. The rectangular shape includes, for example, a rectangular shape in which the corners are chamfered and a rectangular shape in which the corners are rounded. In this embodiment, the corners of the rectangular shape are rounded. The external electrode 15 has a square shape when viewed in the first direction D1. The square shape includes, for example, a square shape in which the corners are chamfered and a square shape in which the corners are rounded. In this embodiment, the corners of the square shape are rounded.

The housing 3 holds the piezoelectric element 2 as illustrated in FIG. 1. The housing 3 defines, together with an attachment surface of the external device to which the acoustic device 1 is to be attached, an accommodation space that accommodates the piezoelectric element 2. The housing 3 has a vibrator 5, a frame body 6, a buffer member 7, and a pair of attachment parts 8.

As illustrated in FIGS. 1 and 2, the vibrator 5 is a plate-like member formed, for example, of a metal material. Examples of the metal material forming the vibrator 5 include a Ni—Fe alloy, Ni, brass, and stainless steel. The piezoelectric element 2 is provided on the vibrator 5. The vibrator 5 has a main surface 5$a$ to which the main surface 11$b$ of the piezoelectric element 2 is bonded. The main surface 11$b$ and the main surface 5$a$ face each other in the first direction D1, and are bonded to each other by a bonding member (not shown) such as an adhesive or a double-sided tape.

The main surface 5$a$ has a rectangular shape. The main surface 5$a$ has a first side S1 and a second side S2 forming opposite sides to each other, and a third side S3 and a fourth side S4 forming opposite sides to each other. In this embodiment, the main surface 5$a$ has a rectangular shape. The first side S1 and the second side S2 form short sides of the main surface 5$a$. The third side S3 and the fourth side S4 form long sides of the main surface 5$a$. The rectangular shape includes, for example, a rectangular shape in which the corners are chamfered and a rectangular shape in which the corners are rounded. In this embodiment, the corners of the rectangular shape are rounded. In this embodiment, a long side direction of the main surface 5$a$ coincides with the third direction D3. A short side direction of the main surface 5$a$ coincides with the second direction D2.

The piezoelectric element 2 is disposed closer to the fourth side S4 than to the third side S3 when viewed in the first direction D1. The piezoelectric element 2 is disposed at equal distances from the first side S1 and the second side S2 when viewed in the first direction D1. The vibrator 5 has a length in the first direction D1, for example, of 0.3 mm. The vibrator 5 has a length in the second direction D2 (length of the short sides of the main surface 5$a$), for example, of 22 mm. The vibrator 5 has a length in the third direction D3 (length of the long sides of the main surface 5a), for example, of 32 mm.

Figure 4:
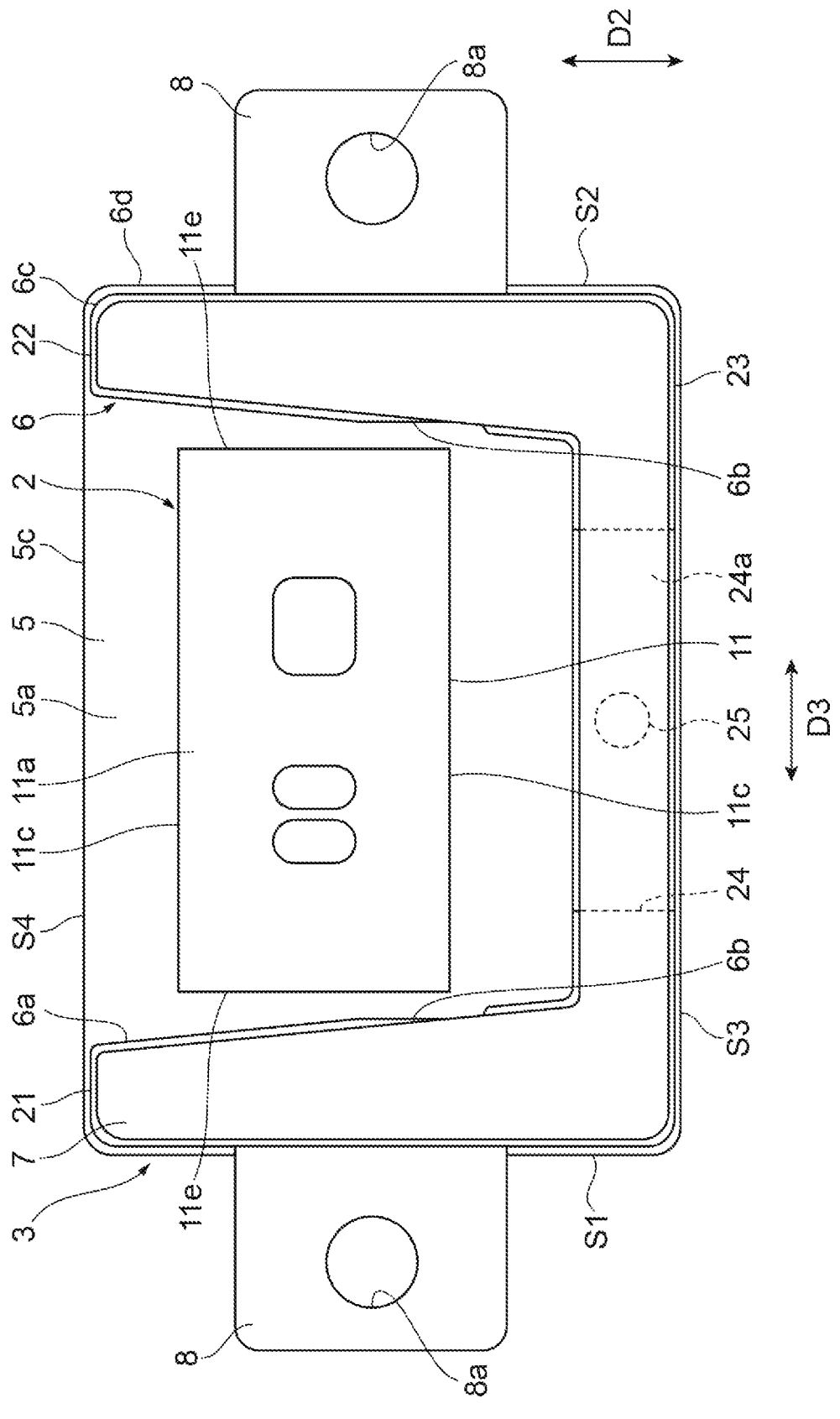
FIG. 4 is a top view illustrating the acoustic device.

FIG. 4 is a top view illustrating the acoustic device. Illustration of the wiring member 4 and a bonding member 9 described further below is omitted in FIG. 4. The frame body 6 is a frame-like member formed, for example, of a resin material. As illustrated in FIGS. 1 and 4, the frame body 6 is bonded to the main surface 5a of the vibrator 5 so as to surround the piezoelectric element 2. The frame body 6 is spaced from the piezoelectric element 2. The frame body 6 has an inner surface 6a that faces toward the piezoelectric element 2. The frame body 6 is bonded to the main surface 5a by a bonding member (not shown) such as an adhesive or a double-sided tape. The frame body 6 is disposed inward of an outer edge 5c of the main surface 5a when viewed in the first direction D1. The frame body 6 is spaced from the outer edge 5c along the entire periphery of the outer edge 5c when viewed in the first direction D1.

The frame body 6 extends along the first side S1, the second side S2, and the third side S3 of the main surface 5a. The frame body 6 is a plate-like member with the first direction D1 being a thickness direction, and is U-shaped when viewed in the first direction D1. The frame body 6 includes a first side part 21, a second side part 22, and a third side part 23 which are integrally formed. The first side part 21 extends along the first side S1. The second side part 22 extends along the second side S2. The third side part 23 extends along the third side S3, and connects one end of the first side part 21 to one end of the second side part 22.

The first side part 21 is spaced from the first side S1, the second side part 22 is spaced from the second side S2, and the third side part 23 is spaced from the third side S3 when viewed in the first direction D1. Clearances between the first side part 21 and the first side S1, between the second side part 22 and the second side S2, and between the third side part 23 the third side S3 when viewed in the first direction D1 are, for example, 0 mm or more and 0.5 mm or less.

The first side part 21 and the second side part 22 face each other in the third direction D3. The piezoelectric element 2 is disposed between the first side part 21 and the second side part 22 in the third direction D3. The first side part 21 and the second side part 22 face the side surfaces 11e of the piezoelectric element 2. Each of the first side part 21 and the second side part 22 has a tapered shape in which the width (length in the third direction D3) decreases as the distance from the third side part 23 increases when viewed in the first direction D1.

The gap between the first side part 21 and the second side part 22 increases as the distance from the third side part 23 increases when viewed in the first direction D1. The inner surface 6a of the first side part 21 is inclined relative to the second direction D2 so as to approach the first side S1 as the distance from the third side part 23 increases when viewed in the first direction D1. The inner surface 6a of the second side part 22 is inclined relative to the second direction D2 so as to approach the second side S2 as the distance from the third side part 23 increases when viewed in the first direction D1.

The inner surface 6a of the first side part 21 and the second side part 22 includes a region 6b that is parallel to the second direction D2. A notched step portion is formed in the inner surface 6a by the region 6b. The gap between the inner surface 6a and the piezoelectric element 2 is kept constant at the region 6b. That is, the inner surface 6a is capable of keeping the gap between the inner surface 6a and the piezoelectric element 2 to a constant degree or more by the region 6b. Consequently, the piezoelectric element 2 and the frame body 6 do not tend to come into contact even if the piezoelectric element 2 and the frame body 6 are misaligned during the manufacture.

A recessed part 24 is provided in a center portion in a length direction (third direction D3) of the third side part 23. The recessed part 24 is provided along an entire width direction (second direction D2) of the third side part 23. A bottom surface of the recessed part 24 forms a disposing surface 24a on which the wiring member 4 is disposed. The disposing surface 24a has a length in the third direction D3 that is greater than a width (length in the third direction D3) of the wiring member 4 (see FIG. 1).

Figure 5:
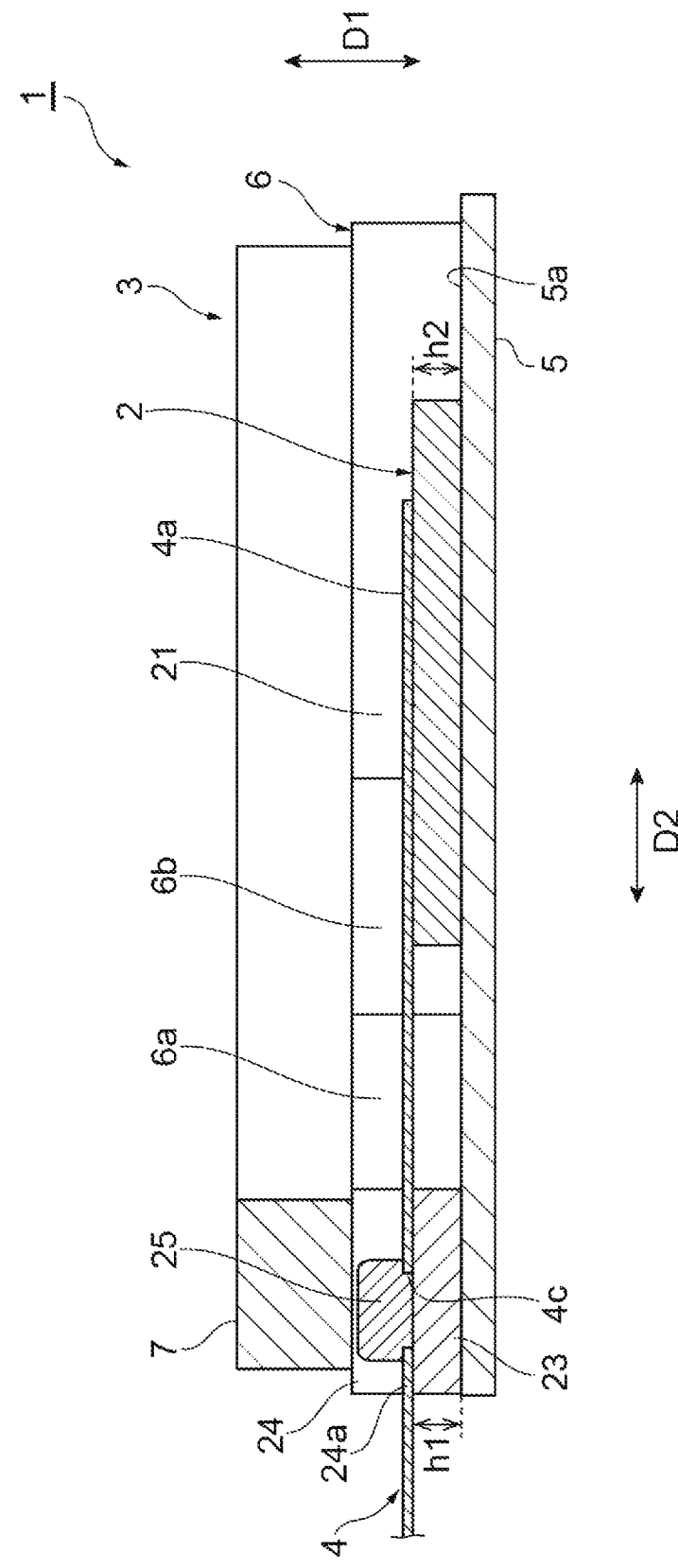
FIG. 5 is a cross-sectional view taken along line V-V in FIG. 1.

FIG. 5 is a cross-sectional view taken along line V-V in FIG. 1. As illustrated in FIG. 5, a height h1 of the disposing surface 24a relative to the main surface 5a of the vibrator 5 is equal to a height h2 of the piezoelectric element 2 relative to the main surface 5a. The attitude of the wiring member 4 can thus be kept flat. Here, the height h1 and the height h2 being equal means that the difference between the height h1 and the height h2 is within ±5%, and preferably within ±3%. The height h1 is, for example, the maximum height of the disposing surface 24a relative to the main surface 5a. The height h2 is, for example, the maximum height of the piezoelectric element 2 relative to the main surface 5a.

Figure 6:
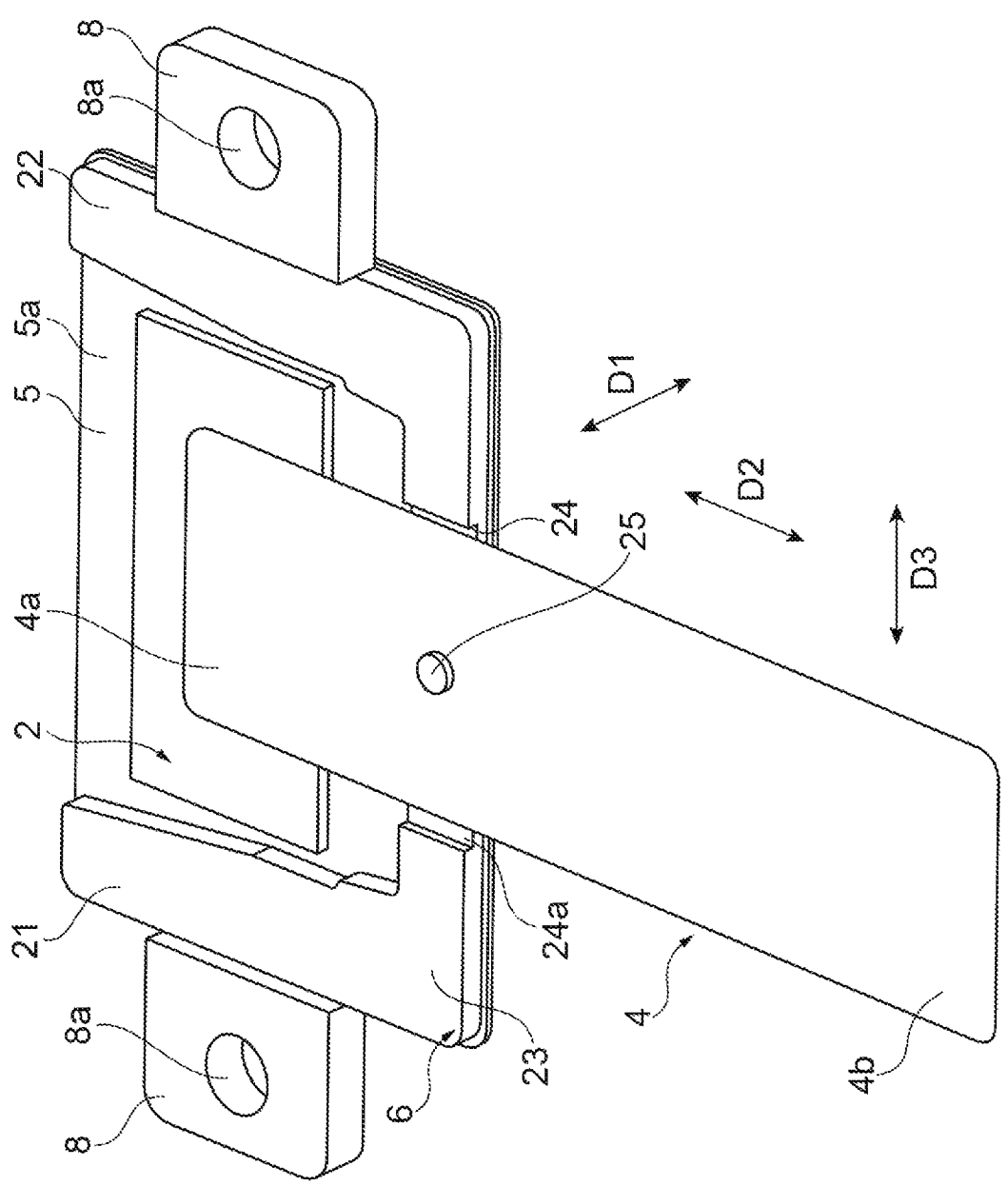
FIG. 6 is a perspective view illustrating a state before a buffer member is attached.

FIG. 6 is a perspective view illustrating a state before a buffer member is attached. As illustrated in FIGS. 5 and 6, the frame body 6 includes a fixing part 25 that rivets the wiring member 4. The fixing part 25 is provided in a center portion in the third direction D3 of the disposing surface 24a. The fixing part 25 is a projection that protrudes in the first direction D1 from the disposing surface 24a. The fixing part 25 is integrally formed with the third side part 23.

As illustrated in FIGS. 1 and 4, the buffer member 7 is disposed on the frame body 6. The buffer member 7 is formed of a foamed material such as sponge. The buffer member 7 is bonded to the frame body 6 by a bonding member (not shown) such as an adhesive or a double-sided tape. The buffer member 7 is disposed inward of an outer edge portion 6d of an outer edge 6c of the frame body 6 that follows along the outer edge 5c of the vibrator 5 when viewed in the first direction D1. The buffer member 7 is spaced from the outer edge portion 6d along the entire length of the outer edge portion 6d when viewed in the first direction D1. A clearance between the buffer member 7 and the outer edge portion 6d is, for example, 0 mm or more and 1 mm or less when viewed in the first direction D1.

The pair of attachment parts 8 are provided outside of the frame body 6 such that the frame body 6 is disposed therebetween in the third direction D3. The pair of attachment parts 8 are plate-like members with the first direction D1 being the thickness direction. The pair of attachment parts 8 are, for example, integrally formed with the frame body 6. The pair of attachment parts 8 and the frame body 6 are integrally formed, for example, by injection molding of resin. One of the attachment parts 8 protrudes from the first side part 21 in the third direction D3. The other of the attachment parts 8 protrudes from the second side part 22 in the third direction D3.

Each of the pair of attachment parts 8 has, for example, a hole 8a formed therein to enable a bolt to be inserted therethrough in the first direction D1. The pair of attachment parts 8 are attached to an external device, for example, by bolts. The acoustic device 1 is thus attached to the external device. The acoustic device 1 is attached to the external device so that the buffer member 7 comes into contact with the external device.

Figure 7:
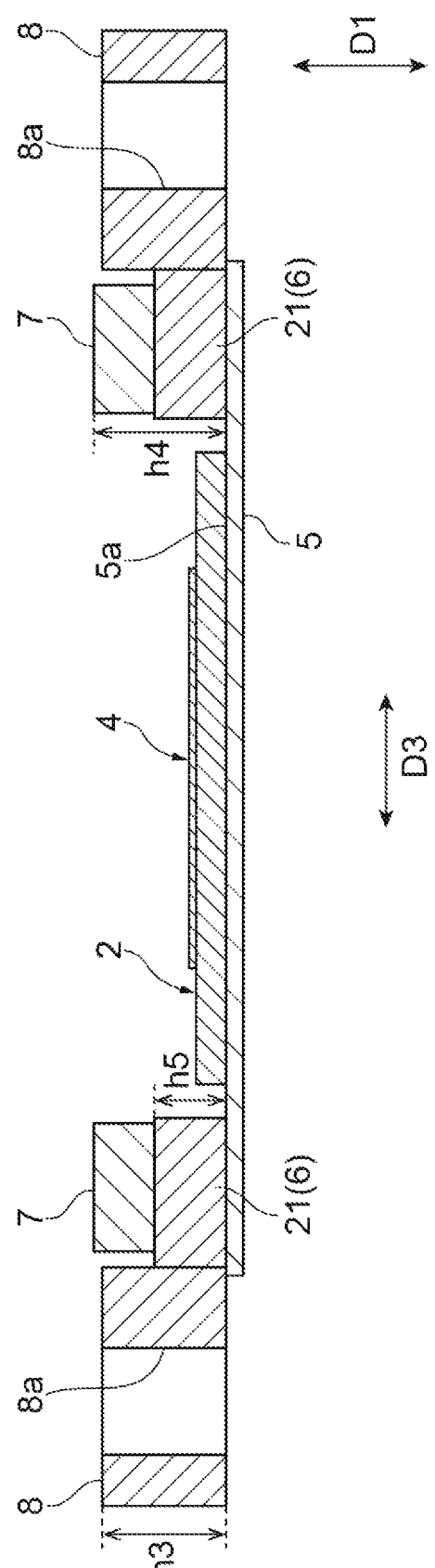
FIG. 7 is a cross-sectional view taken along line VII-VII in FIG. 1.

FIG. 7 is a cross-sectional view taken along line VII-VII in FIG. 1. As illustrated in FIG. 7, a height h3 of the attachment parts 8 relative to the main surface 5a is less than a height h4 of the buffer member 7 relative to the main surface 5a and is more than a height h5 of the frame body 6 (the first side part 21 and the second side part 22) relative to the main surface 5a. The height h3 is, for example, the maximum height of the attachment parts 8 relative to the main surface 5a. The height h4 is, for example, the maximum height of the buffer member 7 relative to the main surface 5a. The height h5 is, for example, the maximum height of the frame body 6 relative to the main surface 5a.

The buffer member 7 is sandwiched between the frame body 6 and the external device and compressed when the acoustic device 1 is attached to the external device. The buffer member 7 is compressed, for example, until the height h4 is equal to the height h3. The height h4 does not become less than the height h3 as the attachment parts 8 serve as a stopper.

Figure 8:
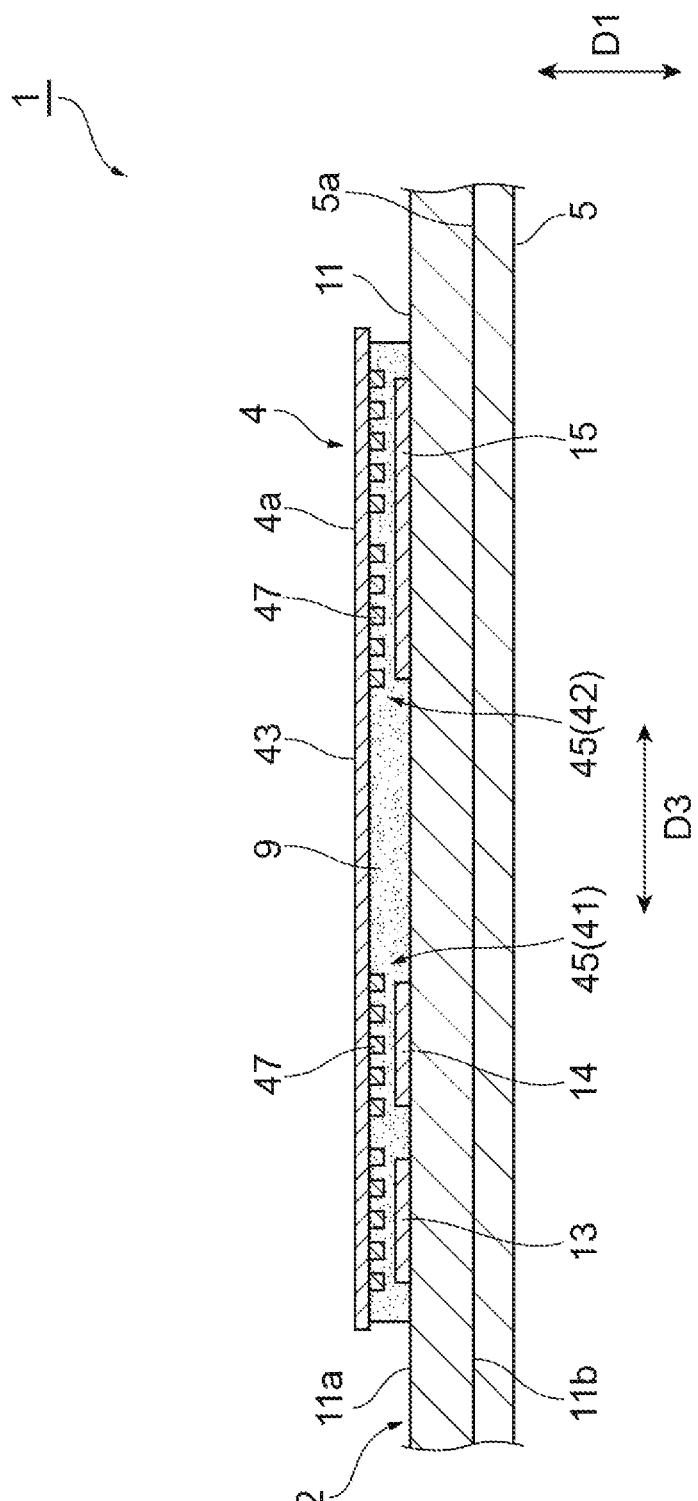
FIG. 8 is a partly enlarged view of FIG. 7.
Figure 9:
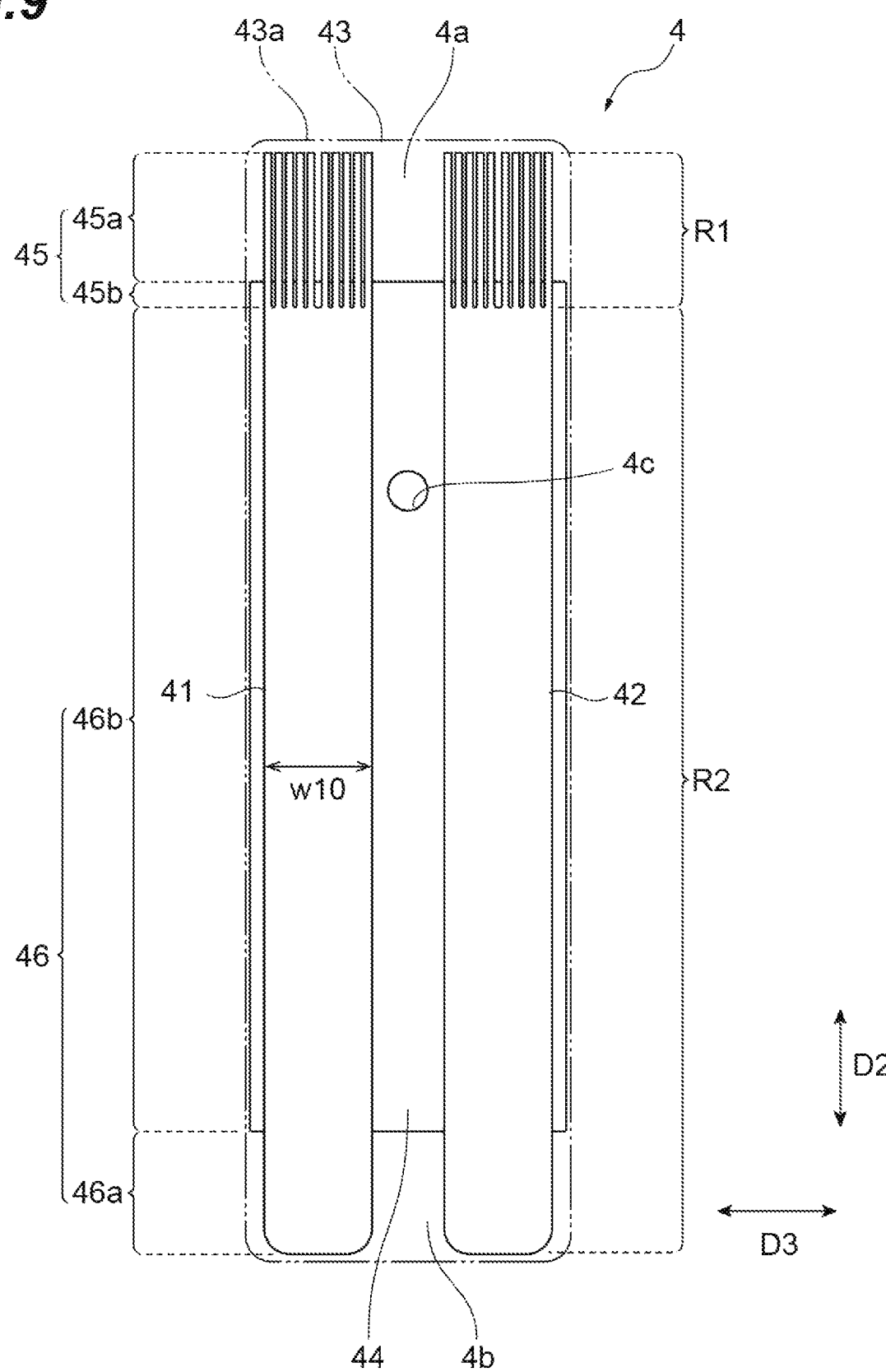
FIG. 9 is a top view illustrating a wiring member.

FIG. 8 is a partly enlarged view of FIG. 7. FIG. 9 is a top view illustrating one example of a wiring member. The wiring member 4 illustrated in FIGS. 1, 8, and 9 is a member that electrically connects the piezoelectric element 2 to the external device. The wiring member 4 is, for example, a flexible printed circuit (FPC) board or a flexible flat cable (FFC). The wiring member 4 has a plate-like, sheet-like, or belt-like shape, and extends in the second direction D2. In this embodiment, the second direction D2 is a length direction of the wiring member 4. The wiring member 4 has an end portion 4a that is bonded to the piezoelectric element 2 by the bonding member 9. The end portion 4a is electrically connected to the external electrodes 13, 14, 15 of the piezoelectric element 2.

The wiring member 4 extends over the frame body 6 and outside of the housing 3 from the piezoelectric element 2. The wiring member 4 has another end portion 4b that is electrically connected to the external device outside of the housing 3. The wiring member 4 is disposed on the disposing surface 24a provided in the third side part 23. A through hole 4c is provided in the wiring member 4 in a position overlapping the fixing part 25 when viewed in the first direction D1. The fixing part 25 fixes the wiring member 4, for example, by hot riveting, with the fixing part 25 inserted through the through hole 4c.

The wiring member 4 has conductor layers 41, 42, a base 43, and a cover 44. In FIG. 9, the base 43 is illustrated in two-dot chain lines so that the shapes of the conductor layers 41, 42 and the cover 44 can be ascertained. The conductor layers 41, 42 are formed, for example, of Cu. The conductor layer 41 is electrically connected to the external electrodes 13, 14. The external electrodes 13, 14 have the same potential. The conductor layer 42 is electrically connected to the external electrode 15. The base 43 and the cover 44 are resin layers formed, for example, of polyimide resin. The conductor layers 41, 42 are disposed between the base 43 and the cover 44. The conductor layers 41, 42 are adhered to the base 43 and the cover 44, for example, by an adhesive layer (not shown).

The conductor layers 41, 42 are disposed on the base 43. The conductor layers 41, 42 are disposed inward of an outer edge 43a of the base 43 when viewed in a thickness direction (first direction D1) of the conductor layers 41, 42. The conductor layers 41, 42 extend in the second direction D2 and are spaced apart from each other in the third direction D3 on the base 43. The conductor layers 41, 42 are sandwiched between the cover 44 and the base 43. The base 43 and the cover 44 are formed having, for example, the same width (length in the third direction D3) and different lengths (length in the second direction D2).

The cover 44 is shorter than the base 43, and both ends of the conductor layers 41, 42 in the second direction D2 are exposed from the cover 44. The through hole 4c passes through the base 43 and the cover 44 between the conductor layers 41, 42.

Each of the conductor layers 41, 42 has a first conductor part 45 that is bonded to the external electrodes 13, 14, 15 by the bonding member 9, and a second conductor part 46 that extends from the first conductor part 45. The first conductor part 45 and the second conductor part 46 are adjacent to each other in the second direction D2 and are directly connected to each other. The first conductor part 45 and the second conductor part 46 have the same width (length in the third direction D3). The first conductor part 45 also includes a portion that is spaced from the bonding member 9 and not directly in contact with the bonding member 9.

The first conductor part 45 is provided to be sparser than the second conductor part 46 when viewed in the first direction D1. That is, the first conductor part 45 has a sparser structure with many gaps such as slits or holes provided therein than the second conductor part 46 when viewed in the first direction D1. In this embodiment, the second conductor part 46 has a dense structure in which no gaps such as slits or holes are provided.

The base 43 has a first region R1 in which the first conductor part 45 is disposed, and a second region R2 in which the second conductor part 46 is disposed. The first region R1 and the second region R2 are adjacent to each other in a length direction of the base 43. The first region R1 is a region on the end portion 4a side, and the second region R2 is a region on the end portion 4b side. One end in a length direction of each of the conductor layers 41, 42 coincides with the end of the first region R1 on the opposite side from the second region R2. The other end in the length direction of each of the conductor layers 41, 42 coincides with the end of the second region R2 on the opposite side from the first region R1.

The first region R1 and the second region R2 have the same width (length in the third direction D3). The first region R1 and the second region R2 extend, for example, along the entire width of the base 43. That is, the widths of the first region R1 and the second region R2 match the width of the base 43. The widths of the first region R1 and the second region R2 may be set to match a width w10 of the conductor layers 41, 42. The conductor layers 41, 42 may have different widths.

A proportion of an area of the first conductor part 45 in the first region R1 (i.e., the proportion of the area of the first conductor part 45 that makes up the total area of the first region R1) when viewed in the first direction D1 is less than a proportion of an area of the second conductor part 46 in the second region R2 (i.e., the proportion of the area of the second conductor part 46 that makes up the total area of the second region R2).

The bonding member 9 is a conductive resin layer including a plurality of conductive particles and resin. The bonding member 9 is formed, for example, of an anisotropic conductive film (ACF) or an anisotropic conductive paste (ACP), and covers the entirety of the external electrodes 13, 14, 15 together. The conductive particles are, for example, metal particles or gold plated particles. The conductive particles have an average particle size, for example, of 10 µm or 20 µm. The resin includes, for example, a thermosetting elastomer.

The bonding member 9 electrically connects the conductor layer 41 to the external electrodes 13, 14. The bonding member 9 electrically connects the conductor layer 42 to the external electrode 15. The external electrodes 13, 14 are bonded to the first conductor part 45 of the conductor layer 41 by the bonding member 9. The external electrode 15 is bonded to the first conductor part 45 of the conductor layer 42 by the bonding member 9. The second conductor part 46 is spaced from the bonding member 9. That is, the second conductor part 46 is not bonded to the external electrodes 13, 14, 15.

The first conductor part 45 includes an exposed portion 45a that is exposed from the cover 44, and a covered portion 45b that is covered by the cover 44. The covered portion 45b is disposed between the exposed portion 45a and the second conductor part 46 in the length direction (second direction D2) of the conductor layers 41, 42. The covered portion 45b is adjacent to the exposed portion 45a and the second conductor part 46, and connects the exposed portion 45a to the second conductor part 46.

The second conductor part 46 includes an exposed portion 46a that is exposed from the cover 44, and a covered portion 46b that is covered by the cover 44. The covered portion 46b is disposed between the exposed portion 46a and the first conductor part 45 in the second direction D2. The covered portion 46b is adjacent to the exposed portion 46a and the first conductor part 45, and connects the exposed portion 46a to the first conductor part 45.

Figure 10:
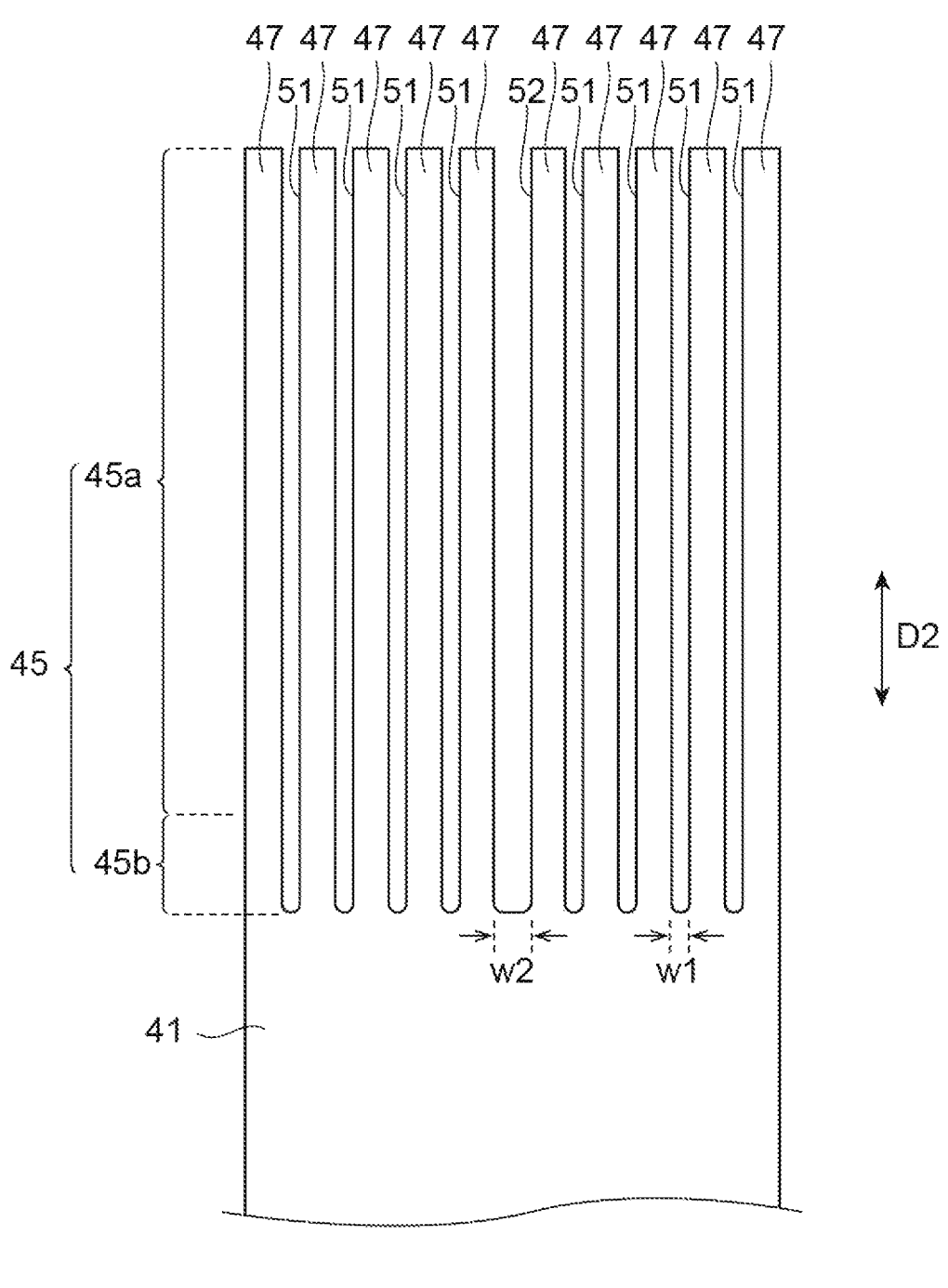
FIG. 10 is an enlarged top view illustrating a first conductor part of a conductor layer.

FIG. 10 is an enlarged top view illustrating a first conductor part. As illustrated in FIGS. 9 and 10, slits 51, 52 that extend in the second direction D2 are provided in the first conductor part 45. The first conductor part 45 has a comb shape. In this example, the number of the slits 51 is eight, and the number of the slit 52 is one. The slits 51, 52 are arranged in the third direction D3. The slit 52 is provided in the center in a width direction (third direction D3) of the wiring member 4. The same number of the slits 51 is provided on both sides of the slit 52 in the third direction D3.

The slits 51, 52 have different widths (length in the third direction D3). A width w1 of the slits 51 is less than a width w2 of the slit 52. The widths w1, w2 are greater than the average particle size of the conductive particles included in the bonding member 9, so that the conductive particles are included inside the slits 51, 52. For example, the width w1 is 100 µm and the width w2 is 200 µm.

The slits 51, 52 have the same length in the second direction D2. The slits 51, 52 have a length in the second direction D2, for example, of 6.0 mm. Terminal positions (positions of ends closer to the end portion 4b) of the slits 51, 52 in the second direction D2 coincide with a boundary position between the first region R1 and the second region R2.

The first conductor part 45 has a plurality of segmented portions 47 that are spaced apart from each other by the slits 51, 52. The segmented portions 47 are spaced apart from each other in a width direction (third direction D3) of the conductor layers 41, 42, and extend in the length direction (second direction D2) of the conductor layers 41, 42. In this example, the number of the segmented portions 47 is ten. The segmented portions 47 have the same width (length in the third direction D3). The segmented portions 47 have a width, for example, of 300 µm. The segmented portions 47 have the same length in the second direction D2. The segmented portions 47 have a length in the second direction D2 that is equal to the length of the slits 51, 52 in the second direction D2, and is, for example, 6.0 mm.

Figure 11:
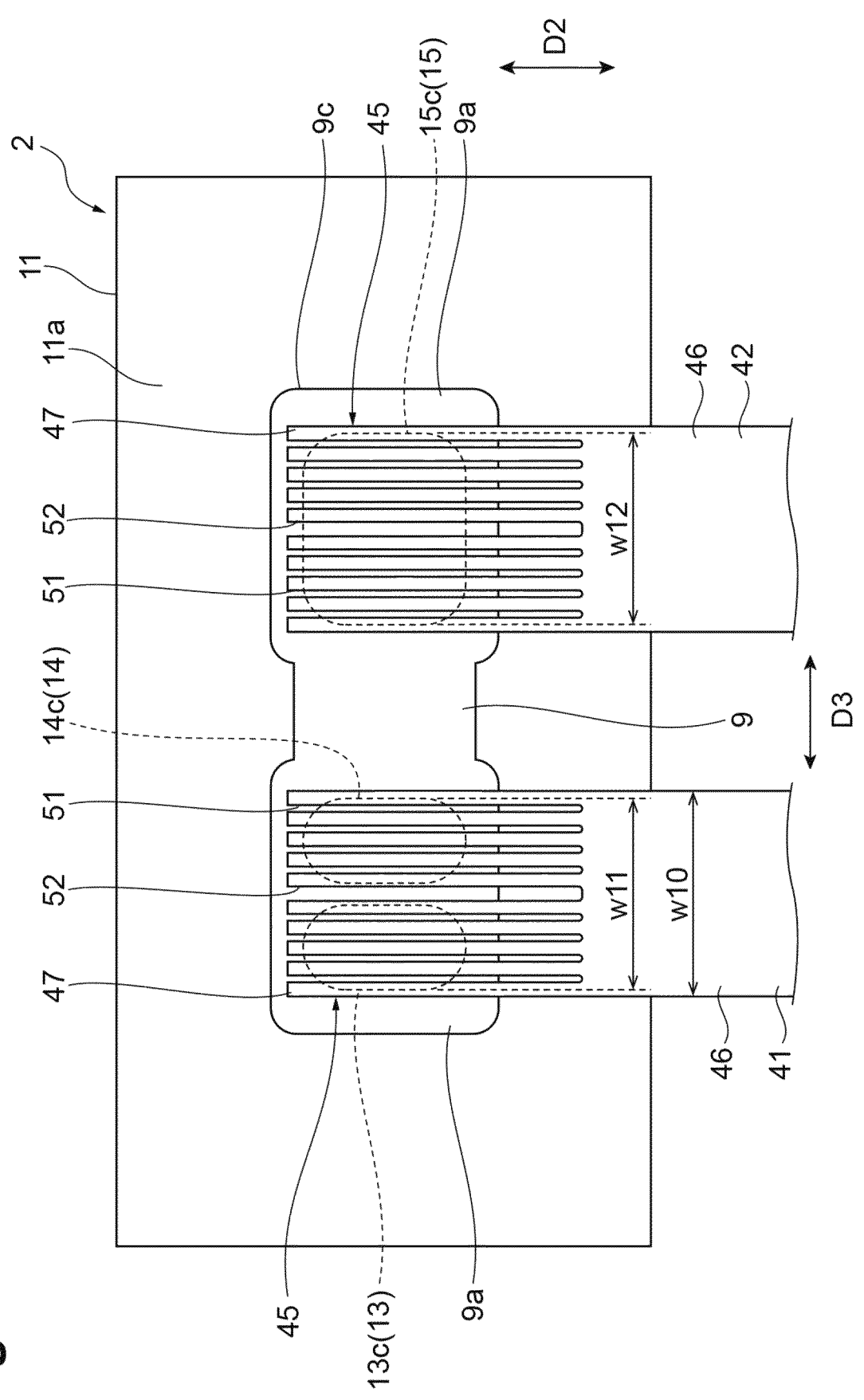
FIG. 11 is a top view illustrating the relationship between external electrodes, a bonding member, and conductor layers.

FIG. 11 is a top view illustrating the relationship between external electrodes, a bonding member, and conductor layers. In FIG. 11, an outer edge 13c of the external electrode 13, an outer edge 14c of the external electrode 14, and an outer edge 15c of the external electrode 15 are illustrated in dashed lines. As illustrated in FIG. 11, the length of the slits 51, 52 in the second direction D2 are greater than a length of the external electrodes 13, 14, 15 in the second direction D2. That is, the length of the first conductor part 45 (see FIG. 9) in the second direction D2 is greater than the length of the external electrodes 13, 14, 15 in the second direction D2. The first conductor part 45 of the conductor layer 41 overlaps the outer edge 13c and the outer edge 14c when viewed in the first direction D1. The first conductor part 45 of the conductor layer 42 overlaps the outer edge 15c when viewed in the first direction D1.

An outer edge 9c of the bonding member 9 includes a portion that is positioned inside the slits 51, 52 when viewed in the first direction D1. The bonding member 9 has a pair of wide parts 9a formed by being expanded when the piezoelectric element 2 and the wiring member 4 were bonded. One of the wide parts 9a covers the entirety of the external electrodes 13, 14. The one of the wide parts 9a overlaps the entirety of the outer edges 13c, 14c. The other of the wide parts 9a covers the entirety of the external electrode 15. The other of the wide parts 9a overlaps the entirety of the outer edge 15c.

In each of the conductor layers 41, 42, widths of the first conductor part 45 and the second conductor part 46 are equal to each other and match the width w10. The width w10 is greater than a width w11 of the external electrode 13 and the external electrode 14, and is greater than a width w12 of the external electrode 15. The width w11 is a length from the end of the external electrode 13 on the opposite side from the external electrode 14 in the third direction D3 to the end of the external electrode 14 on the opposite side from the external electrode 13 in the third direction D3. The width w11 is the sum of a width of the external electrode 13, a width of the external electrode 14, and a width of the gap between the external electrode 13 and the external electrode 14. The width w11, for example, matches the width w12.

A portion of the first conductor part 45 of the conductor layer 41 that is disposed outside of the external electrode 13 and the external electrode 14 when viewed in the first direction D1 is disposed so as to surround the entire periphery of the external electrode 13 and the external electrode 14. A portion of the first conductor part 45 of the conductor layer 42 that is disposed outside of the external electrode 15 when viewed in the first direction D1 is disposed so as to surround the entire periphery of the external electrode 15.

As described above, in the acoustic device 1, the housing 3 has the vibrator 5, which forms a top panel of the housing 3. Thus, since the housing 3 is designed to serve also a vibrator (driver), the acoustic device 1 can be made smaller and with a smaller height than a configuration that uses a separate vibrator attached to the housing. The frame body 6 is disposed inward of the outer edge 5c of the main surface 5a of the vibrator 5, thereby facilitating the positioning of the vibrator 5 and the frame body 6 when stacking the frame body 6 on the vibrator 5 to form the housing 3. This facilitates the manufacture of the acoustic device 1. This also reduces variations between the individual acoustic devices 1 as the vibrator 5 and the frame body 6 do not tend to be misaligned. As a result, the acoustic device 1 that has uniform properties can be provided.

The wiring member 4 has the end portion 4a that is bonded to the piezoelectric element 2, and extends over the frame body 6 and outside of the housing 3. The frame body 6 has the fixing part 25 that rivets the wiring member 4. Since the wiring member 4 is fixed by the fixing part 25, stress does not tend to be applied to the end portion 4*a* of the wiring member 4 bonded to the piezoelectric element 2. Thus, the wiring member 4 does not tend to be removed from the piezoelectric element 2, and the connection between the wiring member 4 and the piezoelectric element 2 can be easily maintained. The bonding member 9 that bonds the piezoelectric element 2 and the end portion 4*a* is formed of an anisotropic conductive film, which has a lower bonding strength compared to solder. Consequently, fixing by the fixing part 25 is especially effective.

The frame body 6 has the disposing surface 24*a* on which the wiring member 4 is disposed. The height h1 of the disposing surface 24*a* relative to the main surface 5*a* is equal to the height h2 of the piezoelectric element 2 relative to the main surface 5*a*. The attitude of the wiring member 4 can thus be kept flat on the piezoelectric element 2 and the disposing surface 24*a*. Consequently, stress does not tend to be applied to the end portion 4*a* of the wiring member 4 bonded to the piezoelectric element 2. Thus, the wiring member 4 does not tend to be removed from the piezoelectric element 2, and the connection between the wiring member 4 and the piezoelectric element 2 can be easily maintained.

The acoustic device 1 is attached to an external device so that the buffer member 7 comes into contact with the external device. Thus, a gap does not tend to be formed between the acoustic device 1 and the external device.

The buffer member 7 is disposed inward of the outer edge 6*c* of the frame body 6 when viewed in the first direction D1. This facilitates the positioning of the frame body 6 and the buffer member 7 when stacking the buffer member 7 on the frame body 6. Manufacture is thus facilitated. Additionally, variations between the individual acoustic devices 1 can further be reduced, since the frame body 6 and the buffer member 7 do not tend to be misaligned. As a result, the acoustic device 1 that has even more uniform properties can be provided.

The housing 3 has the pair of attachment parts 8 that are to be attached to an external device. The acoustic device 1 can thus be easily attached to the external device.

The height h3 of the attachment parts 8 relative to the main surface 5*a* is less than the height h4 of the buffer member 7 relative to the main surface 5*a*. Thus, a gap does not tend to be formed between the acoustic device 1 and the external device, since the buffer member 7 is adhered to the external device by being compressed in the first direction D1 when the acoustic device 1 is attached to the external device. Additionally, the height h3 is greater than the height h5 of the frame body 6 relative to the main surface 5*a*. This suppresses warping of the frame body 6 when attaching the pair of attachment parts 8 to the external device by bolts.

The piezoelectric element 2 is disposed closer to the fourth side S4 than to the third side S3 when viewed in the first direction D1. Since the piezoelectric element 2 is disposed offset and close to the fourth side S4, which forms a sound outlet, the high tone characteristic can be improved.

The first conductor part 45 is provided to be sparser than the second conductor part 46 when viewed in the thickness direction (first direction D1) of the conductor layers 41, 42. That is, compared to the second conductor part 46, many gaps are formed in the first conductor part 45 to retain therein the conductive particles that have flown out from between the external electrodes 13, 14, 15 and the conductor layers 41, 42. Due to the conductive particles remaining in these gaps, the conductive particles also tend to remain between the external electrodes 13, 14, 15 and the conductor layers 41, 42. This enables electrical connection reliability between the piezoelectric element 2 and the wiring member 4 to be improved.

The proportion of the area of the first conductor part 45 in the first region R1 of the base 43 is less than the proportion of the area of the second conductor part 46 in the second region R2 of the base 43. The configuration in which the first conductor part 45 is sparser than the second conductor part 46 when viewed in the first direction D1 is thus achieved.

The conductor layers 41, 42 are disposed inward of the outer edge 43*a* of the base 43 when viewed in the first direction D1. In this case, the entirety of the conductor layers 41, 42 can be held by the base 43. Consequently, damages to the conductor layers 41, 42 are suppressed.

The first conductor part 45 includes the exposed portion 45*a* that is exposed from the cover 44 of the wiring member 4, and the covered portion 45*b* that is covered by the cover 44. Thus, damages to the first conductor part 45 are suppressed, since the first conductor part 45 includes the covered portion 45*b*. In this embodiment, the slits 51, 52 are provided in the first conductor part 45, and roots of the slits 51, 52 are covered by the cover 44 at the covered portion 45*b*. Damages to the first conductor part 45 are thus effectively suppressed.

The first conductor part 45 overlaps the outer edges 13*c*, 14*c*, 15*c* when viewed in the first direction D1. The conductive particles tend to flow out from between the external electrodes 13, 14, 15 and the conductor layers 41, 42 to stepped portions formed between the main surface 11*a* and the external electrodes 13, 14, 15. Since the first conductor part 45 is disposed close to such outer edges 13*c*, 14*c*, 15*c*, outflow of the conductive particles is suppressed.

The second conductor part 46 is spaced from the bonding member 9. Thus, the second conductor part 46 can be configured so as to have no gaps. The slits 51, 52 are provided in the first conductor part 45, so that the configuration in which the first conductor part 45 is sparser than the second conductor part 46 can be easily achieved. Since the conductive particles are included inside the slits 51, 52, the conductive particles also tend to remain between the external electrodes 13, 14, 15 and the conductor layers 41, 42.

The outer edge 9*c* of the bonding member 9 includes a portion that is positioned inside the slits 51, 52 when viewed in the first direction D1. The position of the outer edge 9*c* of the bonding member 9 can thus be easily ascertained through the slits 51, 52. Consequently, it can be ascertained that the entirety of the external electrodes 13, 14, 15 is covered by the bonding member 9.

The slit 52 is disposed in a center portion in a width direction of the first conductor part 45. The width w2 of the slit 52 is greater than the width w1 of the slits 51. A large number of the conductive particles can thus be disposed in the center portion of the first conductor part 45.

Although the embodiments of the present invention have been described, the present invention is not necessarily limited to the embodiments described above, and various modifications are possible without departing from the gist thereof. The embodiments and variations above may be combined as appropriate.

For example, one end portions 41*a*, 42*a* of the conductor layers 41, 42 of the wiring member 4 need not be comb-shaped. The wiring member 4 may be bonded to the external electrodes 13, 14, 15 by a conductive paste or solder. In this case, the conductive paste or solder connecting the conductor layer 41 to the external electrodes 13, 14 is provided spaced from the conductive paste or solder connecting the conductor layer 42 to the external electrode 15.

Figure 12:
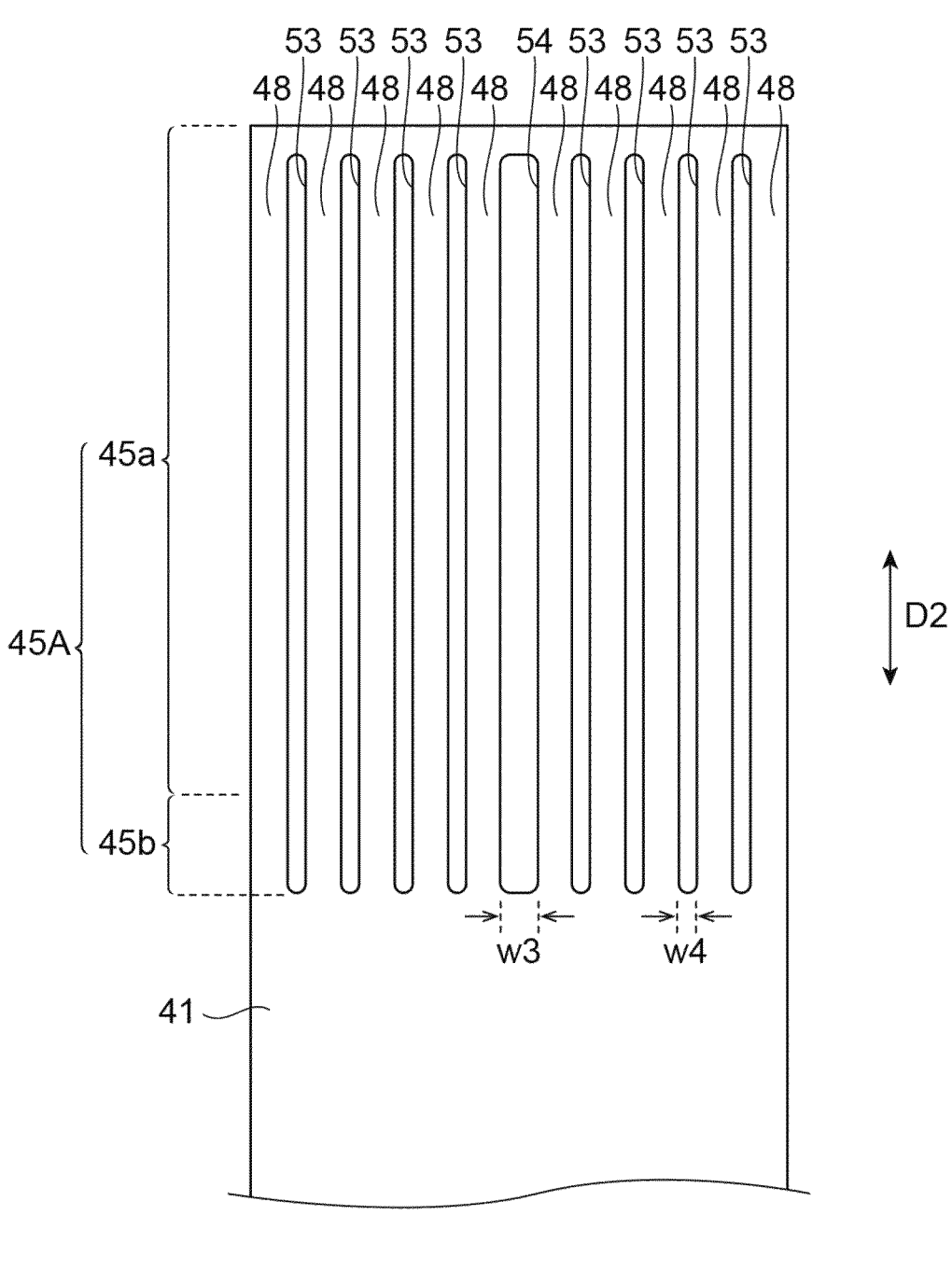
FIG. 12 is an enlarged top view illustrating the first conductor part according to a first variation.

FIG. 12 is an enlarged top view illustrating the first conductor part according to a first variation. As illustrated in FIG. 12, holes 53, 54 extending in the second direction D2 are provided in a first conductor part 45A according to the first variation. In this example, the number of the holes 53 is eight, and the number of the hole 54 is one. The holes 53, 54 are arranged in the third direction D3. The hole 54 is provided in the center in the third direction D3. The same number of the holes 53 is provided on both sides of the hole 54 in the third direction D3.

The holes 53, 54 have different widths (length in the third direction D3). A width w3 of the holes 53 is less than a width w4 of the hole 54. The widths w3, w4 are greater than the average particle size of the conductive particles included in the bonding member 9, so that the conductive particles are included inside the holes 53, 54. For example, the width w3 is 100 μm and the width w4 is 200 μm.

The holes 53, 54 have the same length in the second direction D2. The holes 53, 54 have a length in the second direction D2, for example, of 6.0 mm. Terminal positions (positions of ends closer to the end portion 4b) of the holes 53, 54 in the second direction D2 coincide with a boundary position between the first region R1 and the second region R2.

The first conductor part 45A has a plurality of segmented portions 48 that are spaced apart from each other by the holes 53, 54. In this example, the number of the segmented portions 48 is ten. The segmented portions 48 have the same width (length in the third direction D3). The segmented portions 48 have a width, for example, of 300 μm. The segmented portions 48 have the same length in the second direction D2. The segmented portions 48 have a length in the second direction D2 that is equal to the length of the holes 53, 54 in the second direction D2, and is, for example, 6.0 mm.

Although illustration is omitted, the outer edge 9c (see FIG. 11) of the bonding member 9 includes a portion that is positioned inside the holes 53, 54 when viewed in the first direction D1. The first conductor part 45A of the conductor layer 41 overlaps the outer edges 13c, 14c when viewed in the first direction D1. The first conductor part 45A of the conductor layer 42 overlaps the outer edge 15c when viewed in the first direction D1.

Figure 13:
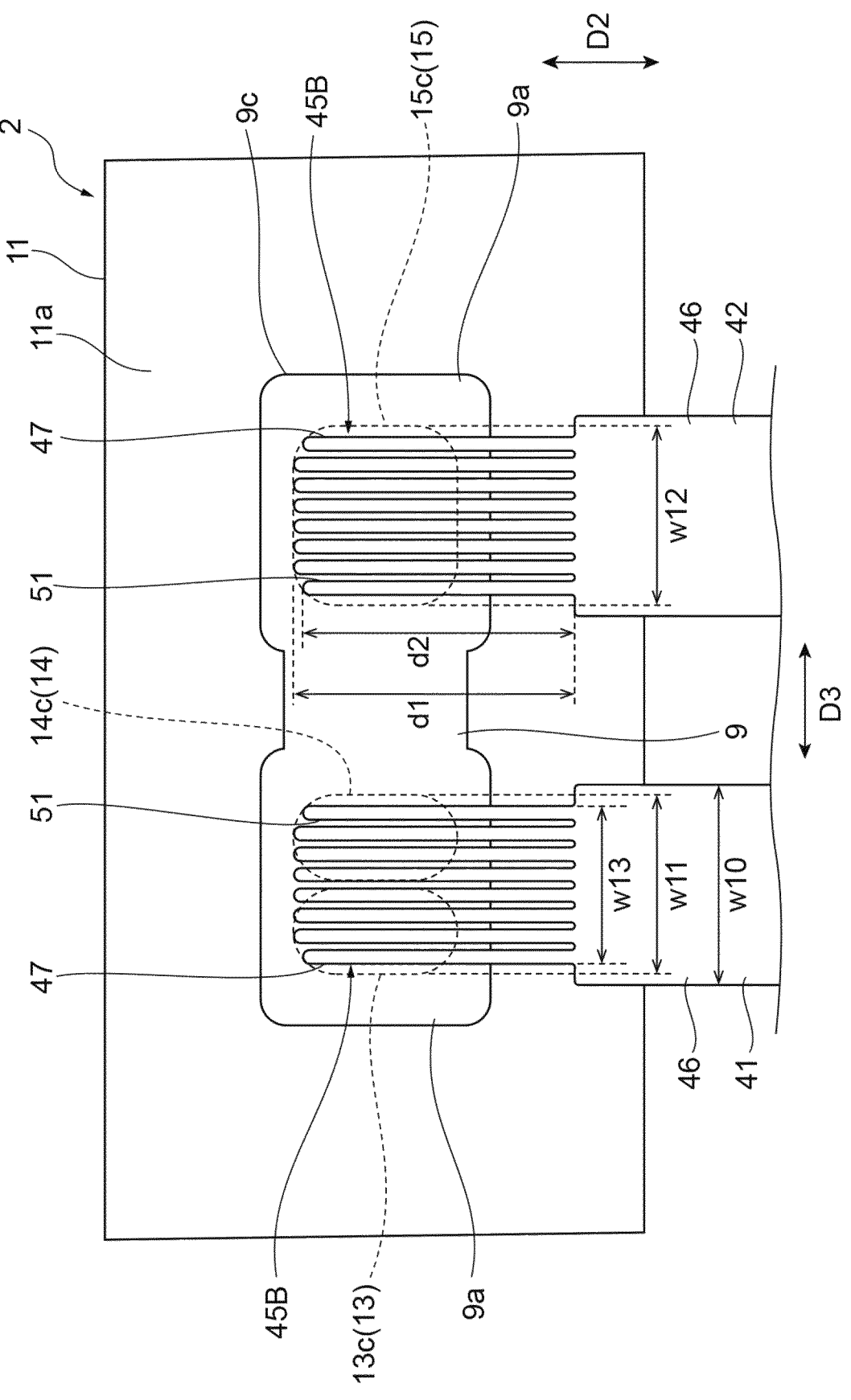
FIG. 13 is a top view for describing the first conductor part according to a second variation.

FIG. 13 is a top view for describing the first conductor part according to a second variation. FIG. 13 illustrates the relationship between external electrodes, a bonding member, and conductor layers. In FIG. 13, the outer edge 13c of the external electrode 13, the outer edge 14c of the external electrode 14, and the outer edge 15c of the external electrode 15 are illustrated in dashed lines similarly to FIG. 11. As illustrated in FIG. 13, a width w13 of a first conductor part 45B according to the second variation is less than the width w10, and less than the width w11 and the width w12. Similarly in the second variation, the width w11 matches the width w12, and a width of the second conductor part 46 matches the width w10.

The first conductor part 45B and the second conductor part 46 are disposed such that the centers in the third direction D3 coincide with each other. Steps are formed between the first conductor part 45B and the second conductor part 46 when viewed in the first direction D1. The end of the external electrode 13 on the opposite side from the external electrode 14 and the end of the external electrode 14 on the opposite side from the external electrode 13 are exposed from the first conductor part 45B of the conductor layer 41 when viewed in the first direction D1. Both ends of the external electrode 15 in the third direction D3 are exposed from the first conductor part 45B of the conductor layer 42 when viewed in the first direction D1.

As illustrated in FIG. 10, eight slits 51 and one slit 52 are provided in the first conductor part 45 according to the embodiment. The first conductor part 45 has ten segmented portions 47. The width w1 of the eight slits 51 is less than the width w2 of the one slit 52. The nine slits 51, 52 have the same length. In other words, the ten segmented portions 47 have the same length. However, as illustrated in FIG. 13, only seven slits 51 are provided in the first conductor part 45B. The first conductor part 45B has eight segmented portions 47. A length d1 of the five slits 51 positioned in a center portion in the third direction D3 is greater than a length d2 of the two slits 51 positioned at either end in the third direction D3. In other words, the six segmented portions 47 positioned in the center portion in the third direction D3 have a length that is greater than the length of the two segmented portions 47 positioned at either end in the third direction D3.

As described above, each of the external electrodes 13, 14, 15 has a rectangular or square shape with the corners rounded when viewed in the first direction D1. Making the slits 51 positioned at either end in the third direction D3 short enable the tips of the segmented portions 47 positioned at either end in the third direction D3 to easily follow along the outer edges 13c, 14c, 15c, and prevent them from protruding from the external electrodes 13, 14, 15 when viewed in the first direction D1.

Portions of the first conductor part 45B of the conductor layer 41 that are disposed outside of the external electrode 13 and the external electrode 14 when viewed in the first direction D1 are disposed only between the external electrode 13 and the external electrode 14, and on a side of the external electrode 13 and the external electrode 14 closer to the second conductor part 46. A portion of the first conductor part 45B of the conductor layer 42 that is disposed outside of the external electrode 15 when viewed in the first direction D1 is disposed only on a side of the external electrode 15 closer to the second conductor part 46.

Similarly in the second variation, the first conductor part 45B is provided to be sparser than the second conductor part 46, so that the electrical connection reliability between the piezoelectric element 2 and the wiring member 4 can be improved. In the second variation, the width w13 is less than the width w11 and the width w12, so that the first conductor part 45B does not cover the entirety of the external electrodes 13, 14 and the external electrode 15. The conductive particles thus tend to remain on the external electrodes 13, 14, 15. Consequently, the conductive particles also tend to remain between the external electrodes 13, 14, 15 and the conductor layers 41, 42. This enables the electrical connection reliability between the piezoelectric element 2 and the wiring member 4 to be improved. The length d2 is less than the length d1. The first conductor part 45B can thus be made sparser.

Although in the embodiments above, the lengths of the slits 51, 52 in the second direction D2 match each other, they need not match each other. In this case, the boundary between the first conductor part 45 and the second conductor part 46 may be set by the position of the slit positioned closest to the end portion 4b. Although in the first variation above, the lengths of the holes 53, 54 in the second direction D2 match each other, they need not match each other. In this case, the boundary between the first conductor part 45 and the second conductor part 46 may be set by the position of the hole positioned closest to the end portion 4*b*.

A slit(s) extending in the third direction D3 may be provided in the first conductor part 45. In this case, the slit(s) will function as an anchor against force in the second direction D2, so that the wiring member 4 will not tend to be removed from the piezoelectric element 2 even if the wiring member 4 is pulled in the second direction D2. A slit(s) and a hole(s) may both be provided in the first conductor part 45. The shape of the hole(s) is not limited to the shape in the first variation above.

The embodiments and variations above may be combined as appropriate.

What is claimed is:

1. An acoustic device comprising:
a piezoelectric element; and
a housing holding the piezoelectric element,
wherein the housing includes a vibrator having a main surface to which the piezoelectric element is bonded, and a frame body bonded to the main surface to surround the piezoelectric element,
wherein the frame body is disposed inward of an outer edge of the main surface when viewed in a direction perpendicular to the main surface,
wherein the housing includes an attachment part to be attached to an external device,
wherein the housing further includes a buffer member disposed on the frame body, and
wherein a height of the attachment part relative to the main surface is less than a height of the buffer member relative to the main surface, and more than a height of the frame body relative to the main surface.

2. The acoustic device according to claim 1, further comprising a wiring member having an end portion connected to the piezoelectric element, the wiring member extending over the frame body and outside of the housing,
wherein the frame body includes a fixing part that rivets the wiring member.

3. The acoustic device according to claim 1, further comprising a wiring member having an end portion connected to the piezoelectric element, the wiring member extending over the frame body and outside of the housing,
wherein the frame body has a disposing surface on which the wiring member is disposed, and
wherein a height of the disposing surface relative to the main surface is equal to a height of the piezoelectric element relative to the main surface.

4. The acoustic device according to claim 1, wherein the housing further includes a buffer member disposed on the frame body.

5. The acoustic device according to claim 4, wherein the buffer member is disposed inward of a portion of an outer edge of the frame body that follows along the outer edge of the main surface when viewed in the direction perpendicular to the main surface.

6. The acoustic device according to claim 1,
wherein the frame body is formed of a resin material.

7. The acoustic device according to claim 1,
wherein the piezoelectric element is a bimorph type.

8. An acoustic device comprising:
a piezoelectric element; and
a housing holding the piezoelectric element,
wherein the housing includes a vibrator having a main surface to which the piezoelectric element is bonded, and a frame body bonded to the main surface to surround the piezoelectric element, wherein the frame body is disposed inward of an outer edge of the main surface when viewed in a direction perpendicular to the main surface,
wherein the main surface has a rectangular shape, and has a first side and a second side forming opposite sides to each other and a third side and a fourth side forming opposite sides to each other,
wherein the frame body extends along the first side, the second side, and the third side,
wherein the piezoelectric element is disposed closer to the fourth side than to the third side when viewed in the direction perpendicular to the main surface, and
wherein the frame body is U-shaped when viewed in the direction perpendicular to the main surface, the frame body including a first side part extending along the first side, a second side part extending along the second side, and a third side part extending along the third side.

9. The acoustic device according to claim 8,
wherein the first side and the second side form short sides of the main surface and the third side and the fourth side form long sides of the main surface.

10. The acoustic device according to claim 8,
wherein the piezoelectric element is disposed closer to the fourth side than to the third side when viewed in the direction perpendicular to the main surface.

11. The acoustic device according to claim 8,
wherein a gap between the first side part and the second side part increases as a distance from the third side part increases when viewed in the direction.

12. The acoustic device according to claim 11,
wherein an inner surface of the first side part and an inner surface of the second side part include regions that are parallel to each other.

13. The acoustic device according to claim 8, further comprising a wiring member having an end portion connected to the piezoelectric element, the wiring member extending over the frame body and outside of the housing,
wherein a recessed part is provided in a center portion in a length direction of the third side part, and
the wiring member is disposed in the recess.

14. The acoustic device according to claim 8, further comprising a wiring member having an end portion connected to the piezoelectric element, the wiring member extending over the frame body and outside of the housing,
wherein the frame body includes a fixing part that rivets the wiring member.

15. The acoustic device according to claim 8, further comprising a wiring member having an end portion connected to the piezoelectric element, the wiring member extending over the frame body and outside of the housing,
wherein the frame body has a disposing surface on which the wiring member is disposed, and
wherein a height of the disposing surface relative to the main surface is equal to a height of the piezoelectric element relative to the main surface.

16. The acoustic device according to claim 8, further comprising a wiring member having an end portion connected to the piezoelectric element, the wiring member extending over the frame body and outside of the housing,
wherein the frame body has a disposing surface on which the wiring member is disposed, and
wherein a height of the disposing surface relative to the main surface is equal to a height of the piezoelectric element relative to the main surface.

17. The acoustic device according to claim 16, wherein the buffer member is disposed inward of a portion of an outer edge of the frame body that follows along the outer edge of the main surface when viewed in the direction perpendicular to the main surface.

18. The acoustic device according to claim 8, wherein the frame body is formed of a resin material.

19. The acoustic device according to claim 8, wherein the piezoelectric element is a bimorph type.

\* \* \* \* \*